(12) United States Patent
Sampsell

(10) Patent No.: US 6,496,122 B2
(45) Date of Patent: *Dec. 17, 2002

(54) IMAGE DISPLAY AND REMOTE CONTROL SYSTEM CAPABLE OF DISPLAYING TWO DISTINCT IMAGES

(75) Inventor: Jeffrey B. Sampsell, Vancouver, WA (US)

(73) Assignee: Sharp Laboratories of America, Inc., Camas, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,693
(22) Filed: Jun. 26, 1998
(65) Prior Publication Data
US 2002/0057209 A1 May 16, 2002

(51) Int. Cl.[7] ............................................... G08C 19/00
(52) U.S. Cl. ........................ 340/825.69; 340/825.72; 340/825.25; 348/7; 348/734; 348/10; 348/12; 345/2.2; 345/211; 345/730
(58) Field of Search ....................... 340/825.69, 825.72, 340/825.25; 348/734, 7, 10, 12; 345/1, 2.2, 211, 730; 455/6.2

(56) References Cited

U.S. PATENT DOCUMENTS

| 5,003,396 | A | | 3/1991 | Kang | |
|---|---|---|---|---|---|
| 5,307,055 | A | * | 4/1994 | Baskin et al. | 345/1 |
| 5,410,326 | A | * | 4/1995 | Goldstein | 348/734 |
| 5,537,107 | A | | 7/1996 | Funado | |
| 6,002,450 | A | * | 12/1999 | Darbee et al. | 348/734 |
| 6,052,556 | A | * | 4/2000 | Sampsell | 455/6.2 |
| 6,097,441 | A | * | 8/2000 | Allport | 348/552 |

OTHER PUBLICATIONS

Dorf, R.C., *The Engineering Handbook*, CRC Press, 1993.
Horowitz, P., et al., *The Art of Electronics*, Cambridge University Press, Second Edition, 1989.

* cited by examiner

Primary Examiner—Brian Zimmerman
Assistant Examiner—Yves Dalencourt
(74) Attorney, Agent, or Firm—Robert D. Varitz, P.C.

(57) ABSTRACT

An image display system capable of displaying two distinct images at the same time. One image is shown on an image display device such as a television or computer monitor which is coupled to the image display system. The other image is shown on a remote control included in an image display system. A docking station is also part of the image display system. It is connected by standard audio-visual coaxial cable to the TV and associated video devices and sends compressed digital video signal information to the video remote control by RF communication. Both the docking station and the video remote control have RF antennas and receivers capable of sending digital RF signals. Digital command and information signals are exchanged between the docking station and video remote control to allow control from the remote control of the functions of the TV and other video devices. The remote control has a learning mode with on-screen feedback making the image display system backward and forward compatible with a wide array of image display devices. The invention is thought to be particularly useful for networked computer televisions.

28 Claims, 5 Drawing Sheets

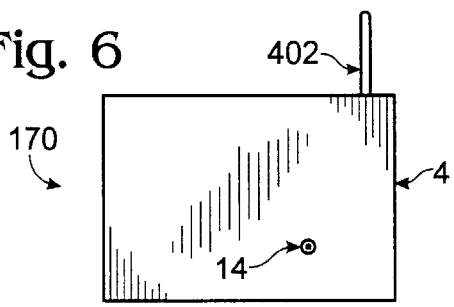
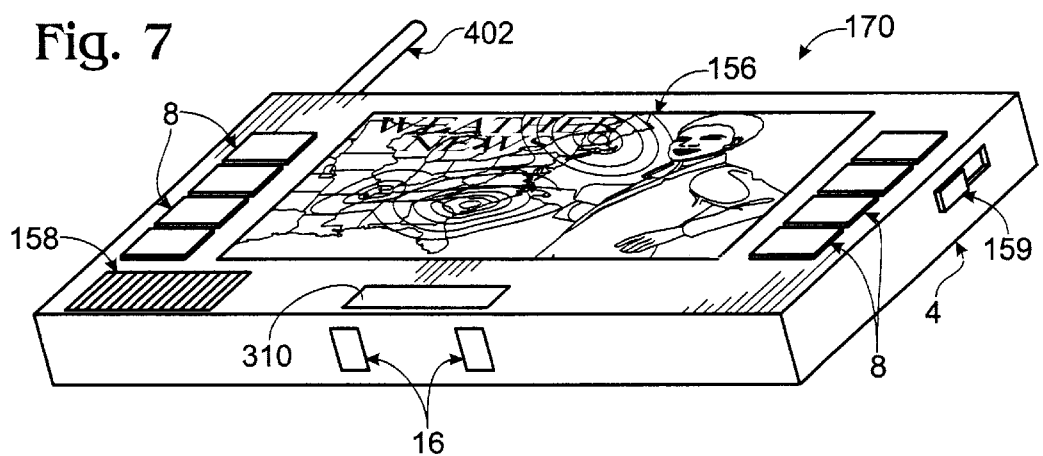
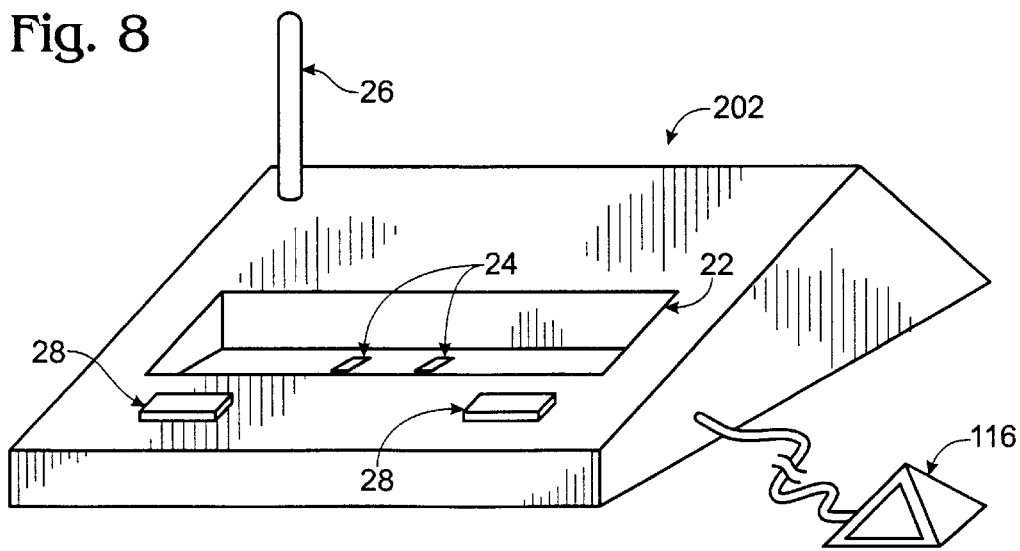

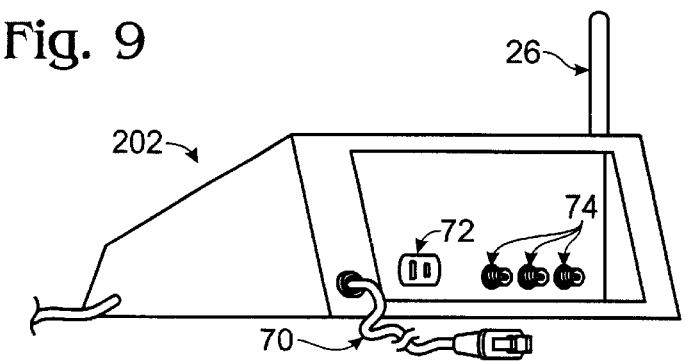
Fig. 9
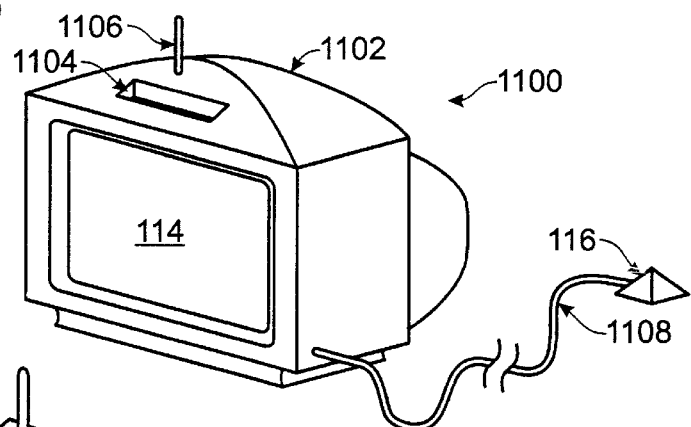
Fig. 10
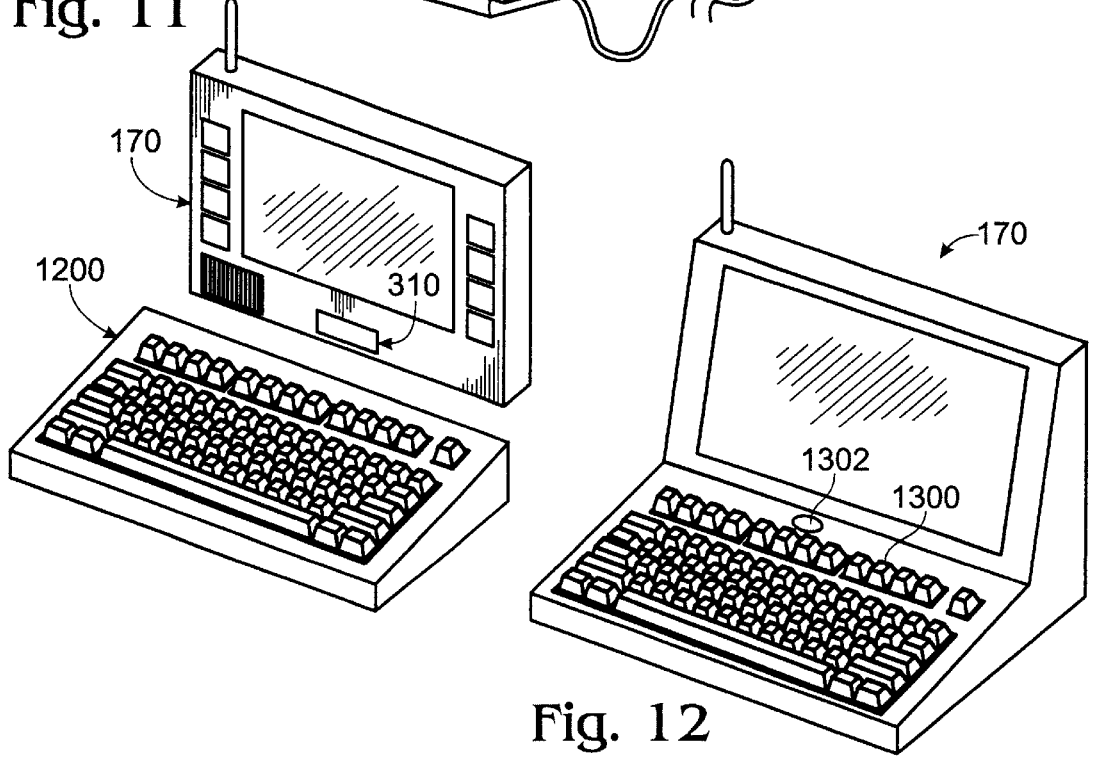
Fig. 11
Fig. 12

IMAGE DISPLAY AND REMOTE CONTROL SYSTEM CAPABLE OF DISPLAYING TWO DISTINCT IMAGES

BACKGROUND

1. Field of the Invention

The present invention relates to the field of remote control, and in particular to controlling image display devices.

2. Description of the Related Art

Television (TV) remote control has radically changed the manner in which many television viewers watch TV. Even the lexicon of television viewing has changed such that viewers regularly "channel surf" by quickly progressing from one channel to another. While the standard remote control has proven quite popular, it has not satisfied all the potential needs of the viewer. For example, some TVs are equipped to display a second smaller picture within a screen of the TV. This "picture within a picture" (PIP) can display a second program, from either a tuner of a video cassette recorder (VCR) or a second tuner within the TV, or it can display a video signal from a VCR tape or a laserdisc. While the viewer with the PIP TV can watch two programs with the PIP window, viewers without PIP cannot monitor programming on a second channel.

Standard remote controls for video devices such as TVs, VCRs, laser disc players, surround-sound systems and digital satellite system (DSS) dishes are simple hand-held devices which send an infrared (IR) signal to an IR sensor located on the front of the video device to control functions of the video display device. To operate the video device with the remote control, the user must be within a specified angle and a limited, direct-line-of-sight distance of operation in front of the video device. Although not in widespread use, some conventional remote controls also permit display on the remote control of the same image that is displayed on the television.

U.S. Pat. No. 5,003,396 issued to C. H. Kang discloses a black in white monitoring system for monitoring a broadcast television system. While the monitoring system of the Kang reference is capable of reproducing a broadcast television picture on a LCD display, the monitoring system is not capable of displaying broadcast television pictures other than the broadcast television picture shown on the associated television set.

U.S. Pat. No. 5,537,107 issued to S. Funado discloses a remote control for use with a video camcorder. While the remote control of the Funado reference is capable of producing a video image on a LCD display, the remote control is not capable of displaying video images other than the video image shown on the associated video apparatus.

Moreover, while remote controls have become quite popular, the proliferation of video devices and associated remote controls has produced a clutter of remote controls for the viewer to control all the video devices connected to the TV. Universal remote controls store commands for a large number of video device types and particular models. They become obsolete as new models of televisions, VCRs, and other video devices are released. While remote controls that can "learn" to emulate the commands of other remote controls are available, they have not gained wide acceptance among consumers due to the difficulty in programming these learning remotes. Users are required to make all of their own decisions regarding the functional assignment of buttons. Additionally, these remotes only provide a limited feedback to users by employing beeps and LED flashes. Such a limited feedback has proven to be confusing and inadequate for many users.

Learning remote controls which accept and then emulate commands of other remote controls may be particularly useful in the new technology of computer television where standards are in flux. In a typical computer television scenario, such as WEB-TV™, a computer signal is sent to a television via computer network. A signal corresponding to image data is displayed on a television screen as it would be on a conventional computer monitor. Computer commands may be entered on a keyboard in communication with the television via infrared transmitters and receivers.

SUMMARY OF THE INVENTION

The present invention relates to a remote control system for use with an image display device. The remote control system is capable of showing an image distinct from another image displayed on the image display device. The remote control system includes a transmitter and a remote control. The transmitter transmits a selected image signal to the remote control. The remote control displays an image that can be distinct from another image displayed on the image display device corresponding to another selected image signal, or it can be the same image displayed on the image display device corresponding to the same selected image signal. The displaying of the images may depend upon a mode of operation selected by the remote control system.

The remote control may be a learning remote control. The learning remote control includes a receiver for receiving an original command signal sent by an original remote control which corresponds to an original command on the original remote control. When a learning algorithm on the learning remote control is activated, such as by pressing a button, the received original command signal is stored in a memory. To indicate which command button should be pressed on an original remote control and whether the emulation signal has been successfully saved in the memory in a location associated with a desired command on the learning remote control, the remote learning control includes feedback mechanisms. The image screen on the remote control is part of the feedback mechanism.

In an alternate embodiment, the invention includes an image display system capable of displaying two distinct images essentially simultaneously. The image display system includes two image displays. One image display is included with the remote control and one is separate from the remote control. A controller selects two image signals from at least two image sources. The images displayed on the two displays may be distinct from the image displayed on the other display.

An advantage of the present invention is that it permits convenient channel monitoring of other channels and the output of multiple image display devices without covering up part of an image displayed on an image screen as in the conventional picture-in-picture (PIP) technology. The invention also offers the advantage of easily programming a learning remote control by displaying feedback information on the image screen on the remote control. The convenience of the learning remote control provides backward compatibility with a wide array of image display devices. The invention's remote control allows a user to operate and view the output of a display device, such as a cable television or a VCR, without being in proximity to the display device. These and other advantages of the invention will become readily apparent to those skilled in the art upon a reading of the following description and a study of the accompanying drawings.

BRIEF DESCRIPTION OF THE DRAWINGS

FIG. 6 is a rear perspective view of the remote control of FIGS. 3–5 in accordance with the present invention.

FIG. 7 is a bottom perspective view of the remote control of FIGS. 3–6 in accordance with the present invention.

FIG. 8 is a front perspective view of a docking station in accordance with the present invention.

FIG. 9 is a rear perspective view of the docking station shown in FIG. 8 in accordance with the present invention.

FIG. 10 is a perspective view of a television with a docking station integrally formed as part of the television in accordance with the present invention.

FIG. 11 is a perspective view of a keyboard for use with a computer television device and a video remote control in accordance with the present invention.

FIG. 12 is a perspective front view of an alternate embodiment of a video remote control adapted for use with an computer television device in accordance with the present invention.

DETAILED DESCRIPTION OF THE INVENTION

The present invention relates to an image display system capable of displaying two distinct images. The image display system includes a remote control having an image screen displaying one of the images. In particular embodiments, the remote is a learning remote control.

A few terms will now be defined. The term "user" herein is consider to include any entity, whether living or inanimate, capable of inputting data to the remote control. For example, a user may be a person controlling a television whose mode of operation is controlled via the remote control. Additionally, computers and other machines may input commands via the remote control.

As used herein the term "image" should be construed to include any present and future types of data capable of display. Video or graphics data are considered to be types of image data.

The term "image source" will be construed to represent any mechanism, apparatus, circuitry, or device that outputs image signals. For instance, conventional video cassette recorders and televisions both have tuners, which are considered herein to be image sources. Computer networks and video display drivers are common image sources for computers. Those of ordinary skill in the art will readily appreciate that many types other image sources are appropriate for use with the invention.

For relevant background material, the reader is directed to the following list of references known to those skilled in the art. Both of the following references are incorporated by reference herein in their entirety: *Electrical Engineering Handbook,* edited by Richard C. Dorf, CRC Press, 1993; and *The Art of Electronics,* Second Edition, Paul Horowitz & Winfield Hill, Cambridge University Press, 1989.

Figure 1:
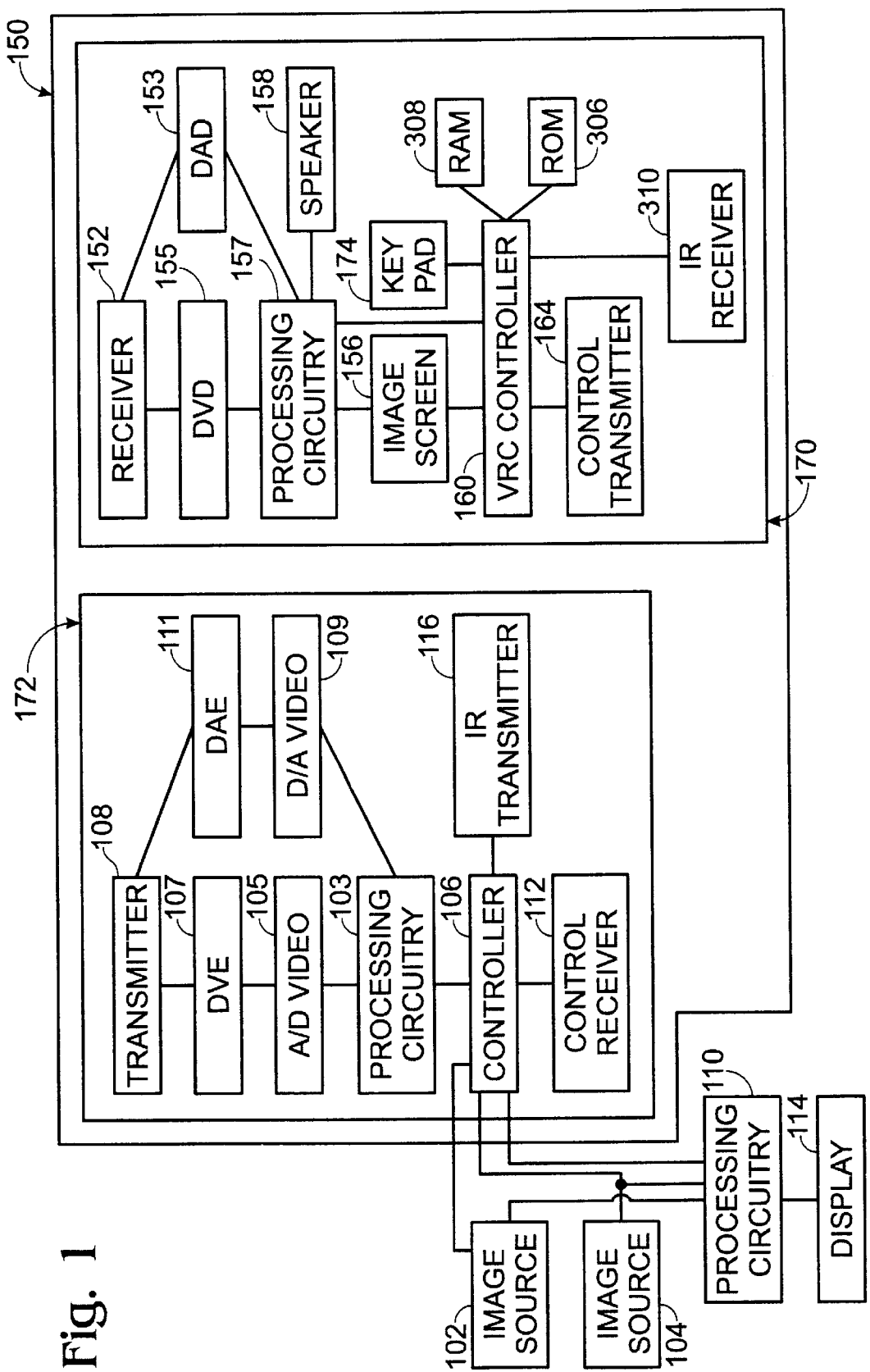
FIG. 1 is a block diagram of a image display system in accordance with the present invention.

FIG. 1 shows a diagrammatic representation of an embodiment of an image display system 150 in accordance with the present invention. The image display system 150 consists of a video remote control (VRC) 170 and an image processor 172. The image processor 172 receives image signals from a plurality of image sources 102, 104 and outputs at least one image signal to the VRC 170.

The image display system 150 has several embodiments. A conventional television and video cassette recorder (VCR) as the image sources 102, 104 can be used with image display system 150 of the present invention. Alternatively, a conventional two-tuner television capable of "picture within a picture" (PIP), having the two tuners as the image sources 102 and 104, can be used with the video remote control system 150. In yet other embodiments, a conventional single tuner television, the single tuner providing image source 102, can be combined with the image display system 150. In such an embodiment, a tuner as image source 104 can be included as part of the image display system 150.

In general, the image sources 102, 104 may be any type of image source capable of outputting image signals. For example, the image sources 102, 104 may be standard television receivers, cable television boxes, digital satellite hook-ups, or data hook-ups as required for a computer or a computer television. In addition, the image source 102 may output a different type of data than that output by the image source 104. This would occur, for example, when the image source 102 outputs a standard television signal, and the image source 104 outputs a computer television signal. In some instances, one or both of the receivers 102, 104 also output audio signals associated with the image signals.

Other embodiments will be readily apparent to those of ordinary skill in the art upon a further reading of the detailed description of the invention below. The output image signals of sources 102 and 104 are input to a controller 106, which determines which of the image signals is sent to a transmitter 108 and which is sent to external processing circuitry 110 for display on display 114. The controller 106 selects the signals based on a control signal received from a control receiver 112. Of course, the controller 106 can take many forms. For instance, the controller 106 may be formed from a multiplexer, or other switching circuitry. Other controllers 106 will be readily apparent to those of ordinary skill in the art. The controller 106 is connected to the external processing circuitry 110 to allow direct hard-wired control of the external processing circuitry 110 and the external display 114. Alternatively, an IR transmitter 116 may be connected to the controller 106 to control the external processing circuitry 110 and the external display 114, as described below.

The selected image signals output by the controller 106 are displayed on separate displays. If the image signals output by the image sources 102, 104 are distinct, then the image signals selected by the controller 106 and output to the transmitter 108 and processing circuitry 110 may also be distinct. Alternatively, the controller 106 can select one image signal from one source for display on separate displays.

Processing of the image signal sent to the external processing circuitry 110 will be discussed followed by a discussion of the processing of the image signal output sent to the transmitter 108. The external processing circuitry 110 essentially performs standard processing as required. In the case of a video or audio-video signal, the external processing circuitry 110 can be that of a television. The external processing circuitry 110 is well-known to those skilled in the art and includes, for example, horizontal and vertical output circuitry. Moreover, the processing circuitry 110 may handle either analog or digital image signals where appropriate. An output of the external processing circuitry 110 is sent to an external display 114. Examples of suitable displays 114 include cathode ray screens, television screens, liquid crystal displays, and computer data displays. These screens can be black and white, color monochrome such as blue-scale, or color.

The image signal eventually output to the transmitter 108 is input to processing circuitry 103. As with the external processing circuitry 110 associated with the external display 114, the processing circuitry 103 separates the video component of the image signal received from the controller 106 from the audio component of the image signal. The video component of the image signal is output from the processing circuitry 103 to a video analog to digital converter 105, if the video is analog. If digital, no such conversion is necessary. The video analog to digital converter 105 converts the video component of the image signal from an analog signal to a digital signal. This digital video component of the image signal is output from the video analog to digital converter 105 to a digital video encoder (DVE) 107. The DVE 107 encodes the digital video component of the image signal for transmission by the transmitter 108. This encoded signal is output from the DVE 107 to the transmitter 108.

The DVE 107 may compress the selected signal obtained from the controller 106. The DVE 107 permits more image data to be transmitted over a limited bandwidth than without compression, thereby improving transmission speed and picture quality. In encoding signals the DVE 107 may use the DVC format or a wavelet CODEC such as the Analog Devices™ ADV601LC, or that of a number of other types of digital video encoders, including MPEG1 and MPEG2 encoders.

The audio component of the image signal is output from the processing circuitry to an audio analog to digital converter 109 which converts the audio component of the image signal from an analog signal to a digital signal, if the audio signal is digital. If not, no such compression is necessary. This digital audio component of the image signal is output from the audio analog to digital converter 109 to a digital audio encoder (DAE) 111. The DAE 111 encodes the digital audio component of the image signal for transmission by the transmitter 108 using known compression and encoding techniques. This encoded signal is output from the DAE 111 to the transmitter 108.

The transmitter 108 multiplexes the encoded audio and video signals and transmits the selected image signal to a receiver 152 in the VRC 170. As currently preferred, the transmitter 108 transmits the image signal as a radio frequency (RF) signal. In some embodiments, the RF frequencies are between 2400 to 2483.5 MHz. The actual RF frequency selected depends on the portion of the frequency spectrum allocated for such uses by the appropriate government agency. Spread spectrum techniques can be used to send compressed data at higher data transmission rates. Of course, this signal may be transmitted at other frequencies, such as infra red (IR), or using other media, such as cable.

As shown in FIG. 1, the receiver 152 is part of a remote control 170 which is included with the image display system 150. The receiver 152 is capable of, but not limited to, receiving signals at the frequency sent by the transmitter 108. The receiver 152 demultiplexes the selected image signal into separate audio and video components. The audio component is input to a digital audio decoder (DAD) 153 which decodes the encoded audio component of the selected image signal received by the receiver 152. Similarly, the video component is input to the digital video decoder (DVD) 155 to decode the encoded video component of the selected image signal received by the receiver 152. The decoded outputs from the DAD 153 and DVD 155 are input to the VRC processing circuitry 157. The VRC processing circuitry processes the decoded audio and video components of the selected image signal for display. The audio component of the selected image signal is output from the processing circuitry 157 to the speaker 158. The video component of the selected image signal is output from the processing circuitry 157 to the VRC image screen 156. As the image displayed on the image screen 156 is capable of being distinct from the image displayed on the external display 114, the present invention is capable of displaying two distinct images essentially simultaneously.

The illustrated embodiment does not use a digital to analog converter between the receiver 152 and the image screen 156 because the image screen is assumed to be a flat panel display, such as an LCD. An alternate embodiment of the present invention, however, could use a cathode ray tube (CRT) in place of the flat panel, which would require the use of a digital to analog converter (DAC).

Alternate embodiments could also use a computer display, plasma display, plasma addressed liquid crystal (PALC) display, projection display, or other display device. This alternate embodiment of the present invention may have an analog video path parallel to the present video path shown in FIG. 1 where the output of the path is connected to an output jack (not shown) for connection to an external TV or other display device.

When the image signal output by the controller 106 to the transmitter 108 has a corresponding audio signal, that audio signal is also transmitted by the transmitter 108 to the receiver 152. The audio signal is decoded by the DAD 153. It is then processed by the processing circuitry 157 (typically including a DAC) and sent to an audio output device such as a speaker 158. Clearly, the speaker 158 may be part of the remote control 170 as shown in FIG. 1, or it may be connected to the remote control 170 and remote control system 150 via an output jack (not shown) on the remote control 170. As is readily apparent to those skilled in the art, the speaker 158 may be replaced by audio output equipment such as an amplifier, headphones, earphones, or the like.

The remote control 170 includes a VRC controller 160, which produces a control signal. The VRC controller may be implemented with a standard microprocessor and memory, which are connected to the keypad 174. An IR receiver 310 is connected to the VRC controller 160. The remote control 170 may also include read-only memory (ROM) 306 and random access memory (RAM) 308. Alternatively, a flash or other memory could be used in place of the RAM memory 308. In the embodiment of the remote control 170 as a learning remote control (discussed below) the ROM 306 and RAM 308 memories are used in emulating commands of other remote controls. The VRC controller 160 may base its production of a control signal on inputs from a user. The VRC controller 160 could be connected to buttons, track balls, or other selection portions on the video remote control 170 available to a user. The VRC controller 160 may be coupled to the image screen 156 as in a soft-key arrangement or a touch-screen selection arrangement. In a soft-key arrangement, the image screen 156 displays input options corresponding to control signals associated with buttons on the remote control 170. In a touch-screen arrangement, a user may select options displayed on the image screen 156 by touching the image screen 156.

The control signal selected by the VRC controller 160 is output to a control transmitter 164, which transmits the control signal to the image processor 172. The control receiver 112 of the image processor 172 receives the control signal transmitted by the control transmitter 164. Upon receipt, the control signal is sent to the controller 106 where it is used to select the image signals received from the image sources 102, 104. In this fashion, the control signal essentially determines a mode of operation of the image display system 150. The control receiver 112 and control transmitter 164 need not operate at the same frequency as the digital video transmitter and digital video receiver. For example, a band of preferred frequencies of operation of the control receiver 112 and control transmitter 164 lies just above 900 MHz in the band also used by cordless phones and other wireless devices. Other frequencies of operation could be used depending on the particular application and the frequency bands available for such use.

Figure 2:
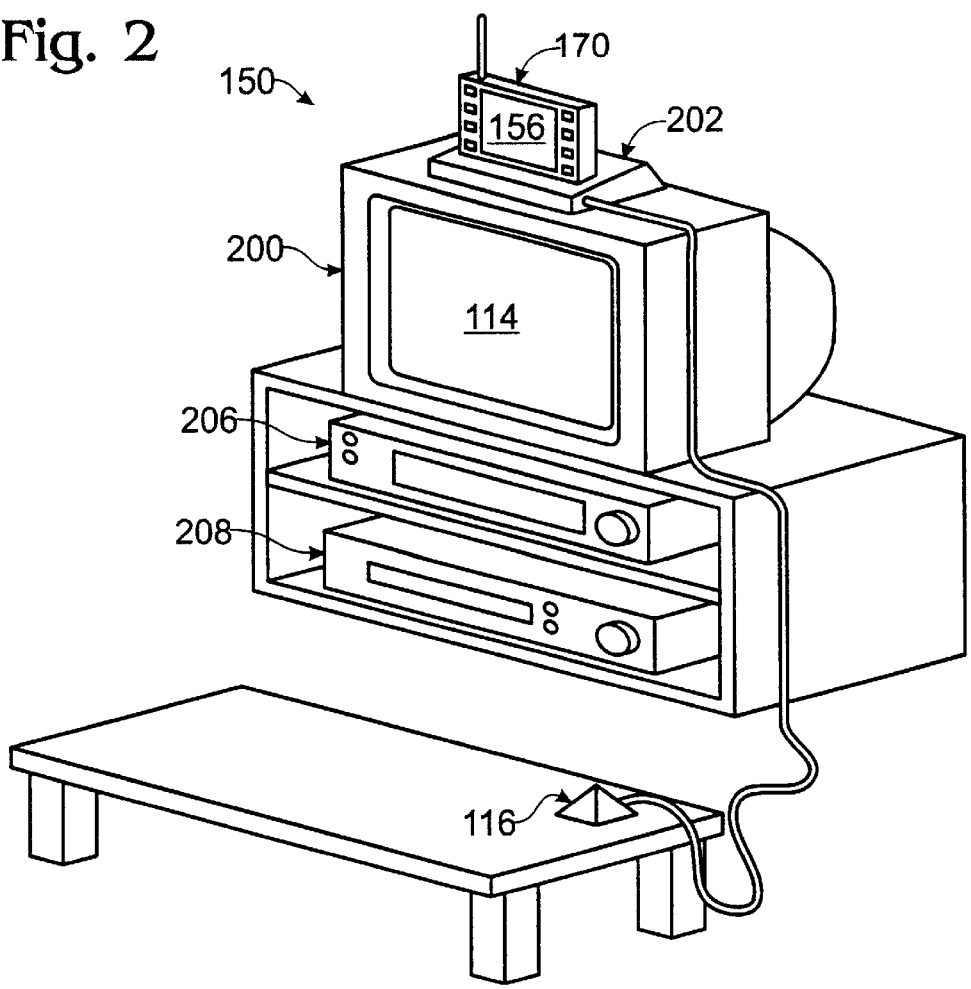
FIG. 2 is a perspective view of an image display system in accordance with the present invention.

FIG. 2 shows an image display system 150 in accordance with the present invention. In the illustrated embodiment, a television 200 is an image source with the display 114 embodied as a television screen. The external processing circuitry 110 is the standard processing circuitry of the television 200. The remote control system 150 includes the remote control 170 and a docking station 202 in which it rests. The image screen 156 resides on the remote control 170. The image display system 150 shown in FIG. 2 comprises a separate docking station 202 and a conventional television 200. In this arrangement, the controller 106, transmitter 108, control receiver 112 and other circuitry of the image processor 172 reside in the docking station 202. The receiver 152, the processing circuitry 154, the image screen 156, the speaker 158, the VRC controller 160, the transmitter 164 and other circuitry reside in the remote control 170.

In the arrangement shown in FIG. 2, the image sources 102 and 104 may be physically located in several alternate places. For example, the television 200 and a VCR 206 both have television-type tuners which act as image sources. A laser disc player 208 generates image data which is received by either the television 200, the VCR 206, or the docking station 202, and constitutes another possible image source. The embodiment of FIG. 2 includes at least two sources of image signals which may be input into the docking station 202. Alternatively, the docking station 202 may include its own tuner to provide the second image source. Once the image signals are input into the docking station 202 and the controller 106 within the docking station 202, the controller 106 can select the desired image signals sent to the remote control 170 and the television 200. One selected image is displayed on the image screen 156, and another selected image is displayed on the display 114. This causes two distinct images to be displayed essentially simultaneously on the remote control 170 and the television 200. This configuration is known as "picture out of picture" or "POP."

Optionally, the IR transmitter 116 is connected to the controller 106 of the docking station 202. It relays and translates information from the control signal received into the docking station 202 from the remote control 170 and sends it to IR receivers (not shown) on either the television 200, VCR 206, or the laser disc player 208. This is one way of permitting backward compatibility of the remote control system 150 of the invention with conventional televisions 200, VCRs 206, laser disc players 208, or any other desired IR-controlled device when the communication frequencies or sequences used to communicate between the docking station 202 and the remote control 170 are different from those of the other devices.

The remote control 170 can also be implemented as a learning remote control. In such an embodiment, the learning remote control 170 is capable of controlling multiple video components by learning control signals associated with various remote controls for the video components. The remote control 170 is not required to be a learning remote control, but by making it so, the remote control 170 becomes backward compatible with conventional image display systems, and, perhaps more important, with future image display devices whose communication codes would be unknown to universal remotes.

A selected image signal is received into the receiver 152 of the remote control 170 from the image processor 172, as previously described in reference to FIG. 1. The receiver 152 demultiplexes the digital audio and video signals and provides the appropriate signal to the DAD 153 and DVD 155. The DVD 155 receives the video component of the selected image signal from the receiver 152 and decodes it. Similarly, the DAD 153 receives the audio component of the selected image signal from the receiver 152 and decodes it. These decoded image signals are then sent from the DAD 153 and DVD 155 to the processing circuitry 157. The signals received by the processing circuitry 157 are then sent to an image screen 156 and the speaker 158. The image screen 156 is part of a feedback mechanism to notify the user of the status of the storage of a desired command.

A particular embodiment of the VRC controller 160 of the remote control 170 introduced in FIG. 1 will now be described. This particular VRC controller 170 includes a central processing unit (CPU) (not shown) which is connected to a user input device such as keypad 174, to ROM 306, RAM 308 and the processing circuitry 157. When the VRC controller 160 is used to control the controller 106, a user inputs a desired mode of operation into the keypad 174. Input signals generated by the keypad 174 are sent to the CPU, which selects appropriate control signals from the ROM 306. These signals retrieved from the ROM 306 are sent to the transmitter 164 which transmits control signals to the control receiver 112.

To program the learning remote control to emulate the commands of an original remote control, a user selects a mode of operation for programming the learning remote control. The programming mode can be selected by a task-specific button or by proceeding through the menus (described below in connection with FIG. 3) of the learning remote control to select the soft key in the proper menu. Once in the programming mode, to train the learning remote the learning remote control prompts the user to select a remote control type to be programmed. In this way a remote control for a TV, having volume and other controls, can be programmed separately from a VCR remote control which has controls specific to the operation and playing of VCR tapes. The correlation of buttons of the key pad 174 with the functions of the type of remote is accomplished according to the instructions stored in ROM 306. Once a type of remote control is selected, the learning remote control prompts the user to press a particular command on the original remote control. The user is prompted by displaying signals on the image screen 156. This is done while positioning the original remote such that the command signals from the original remote are received by the IR sensor 310 of the learning remote control 170. If the command is received by the learning remote control, the command is stored in the RAM 308. The user is then prompted to press the command button of another specific command. In this manner, the learning remote can request commands in a predetermined sequence. Alternatively, the screen may display most or all available commands as, e.g., soft keys. The user can then select the command to be learned in an order desired by the user.

If a command is not received by the learning remote control, or if there is a problem with the learning activator (described below) or storage of the command, the learning remote control displays a command for the user to re-press the command button. In this manner the use of the display of the learning remote control allows the feedback mechanism to indicate to the user that a command from the original remote control has not been properly received by the learning remote control. This interaction between the user and the learning remote control by the feedback mechanism not only simplifies the programming procedure but also assures that all of the commands are properly received and stored by the learning remote control.

To initiate the learning mode, a user presses a "learning activator" button on the keypad 174. This selection prompts the VRC controller 160 to accept an original command received from a conventional remote control via infrared sensor 310. The VRC controller 160 stores the original command signal in the RAM 308. The image screen 156 is connected to VRC controller 160 and displays desired commands which the user may select via the keypad 174. Once the signal received from the infrared sensor 310 has been stored in the RAM 308, the VRC controller 160 sends an image signal to the image screen 156 indicating that the signal corresponding to the original command has been stored. The user may then deactivate the learning mode via the keypad 174 or select another desired command displayed on the image screen 156.

Upon storage and deactivation of the learning mode, the user may select a desired command by pressing a button on the keypad 174. When this occurs, the VRC controller 160 retrieves the corresponding learned original control signal from the RAM 308 and sends it to the control transmitter 164. Thus, the VRC controller 160 associates the original command control signal with the desired command. The control transmitter 164 transmits the control signal to the control receiver 112, which sends it to the controller 106. In this optional arrangement, the controller 106 sends the control signal to an infrared (IR) transmitter 116 of the image processor 172 shown in FIG. 1. In either case, the control signal is sent to the image sources, e.g., video devices 200, 206, 208.

Notice that the infrared sensor 310, VRC controller 160, keypad 174 and RAM 308 essentially act as a translator translating signals received from the original remote control into a data format for storage. Also, the VRC controller 160, transmitter 164, control receiver 112, controller 106 and IR transmitter 116 essentially act as a converter changing an output command signal generated from the signal stored in memory into its original format for control of an image source. Other translators and converters will be readily apparent to those skilled in the art. While the embodiments described above use a keypad and a screen, alternate embodiments of the present invention could employ a touch screen in place of, or in addition to, a keypad.

This discussion has highlighted infra-red transmission and reception since that is the common frequency range for controlling televisions, video cassette recorders, laser-disk players, and other image display devices. The present invention is not limited to infra-red communication but encompasses a broad spectrum of electromagnetic frequencies.

Figure 3:
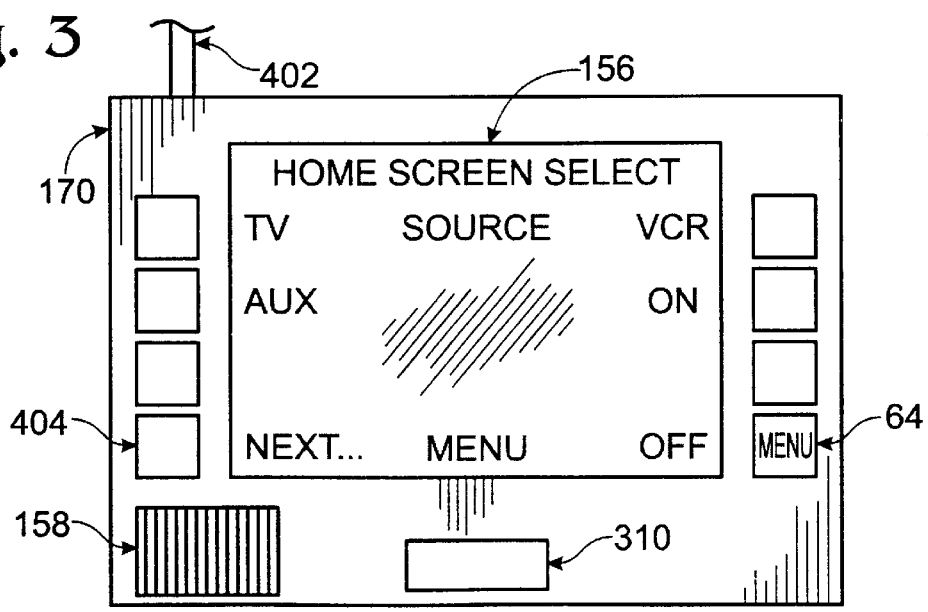
FIG. 3 shows a menu displayed on an image screen of a remote control for selecting a mode of operation of the image display system as shown in FIGS. 1 and 2 in accordance with the present invention.

FIG. 3 shows a front view of the remote control 170 displaying a home menu on the image screen 156. By displaying different menu screens on the image screen 156, the present invention allows a viewer to selectively control functionality of video devices connected to the docking station 202 of FIGS. 8 and 9 described below.

The keypad 174 displayed in FIG. 3 is in a soft-key arrangement with buttons corresponding to selections displayed on the image screen 156. A different soft-key arrangement may be selected by changing the menu displayed on the image screen 156 by pressing the next button 404. The MENU button 400 is a toggle which allows the user to bring up a menu over any image and subsequently eliminate the active menu display. As shown in FIG. 3, the user may select a mode of operation such that one of the image sources 102, 104 is in the TV 200, the VCR 206 or is part of an auxiliary source such as a laser disc 208.

As depicted in FIG. 3, the speaker 158 and infrared sensor 310 reside on the front of the remote control 150. An antenna 402 is also part of the remote control 150 and resides on the top. The antenna 402 is coupled to the receiver 152 and the transmitter 164 shown in FIG. 1. Of course, many other arrangements of buttons in the keypad 174, the speaker 158, the infrared sensor 310, the menu button 400 and the antenna 402 are possible as will be readily apparent to those skilled in the art. An antenna for the 2.4 GHz RF band and higher, e.g., 5 GHz, would be small enough to be concealed within the remote control enclosure.

Figure 4:
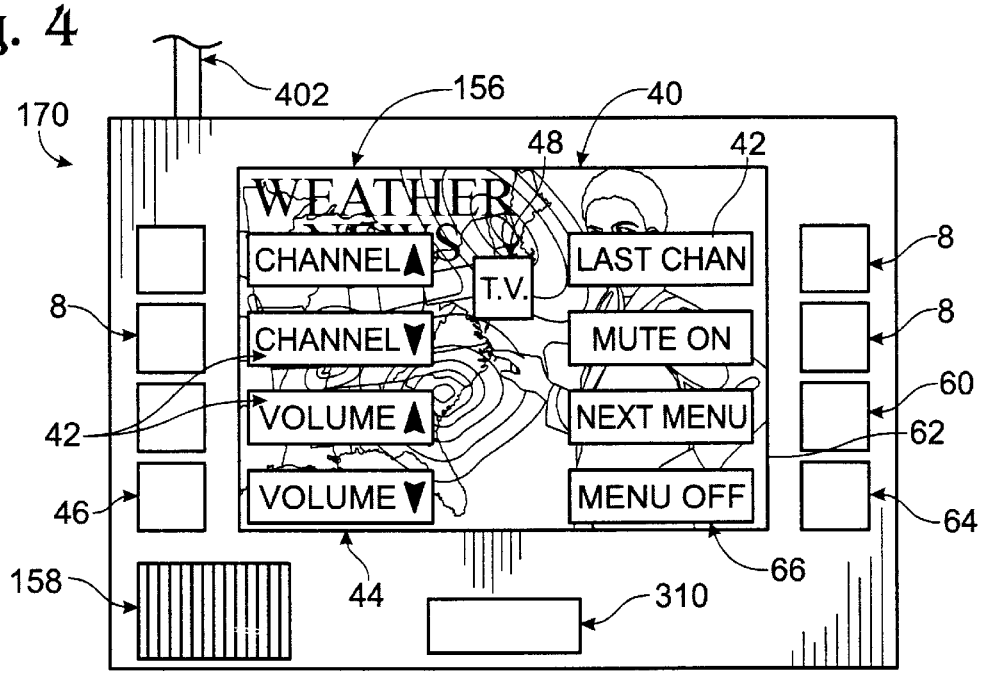
FIG. 4 is a front perspective view of a remote control displaying television menu on an image screen in accordance with the present invention.

FIG. 4 shows a perspective view of the remote control 170 displaying a television menu on the image screen 156. The television menu may be used to control the television 200 or to store original commands corresponding to desired commands while in a learning mode. When menu 40 is displayed on the image screen 156, pushing the buttons 8 produces a change in either a program being displayed on the TV 200 connected to the docking station 202 or sound output from the TV 200. The menu 40 is identified by a menu identifier 48 which indicates what device will be controlled by pushing the buttons 8 of the remote control 170. In the example illustrated, the menu identifier 48 for menu 40 indicates that menu 40 controls functions of the TV connected to the docking station 202 associated with the remote control 170. Pushing the button 46 produces the result shown in the indicator 44, which is a lowering of the volume from the speaker of the TV. The menu 40 is displayed as a superposition of the indicators and menu identifier over the program displayed on the image screen 15 156, such that the program can still be viewed in regions of the image screen 156 not occupied by the indicators and menu identifier. By superpositioning the menu over the program displayed on the image screen 156, a viewer is still able to watch the program while controlling the functions indicated by the menu identifier and indicators of the menu 40.

In such a superposition, menu selections can also be made by touching the image screen 156 in some embodiments. In those embodiments, the hardware keys become unnecessary. Then portions of the image screen 156 are sensitive to the touch of a user to select options displayed on the image screen 156. Use of the touch screen is not incompatible with use of the buttons.

Figure 5:
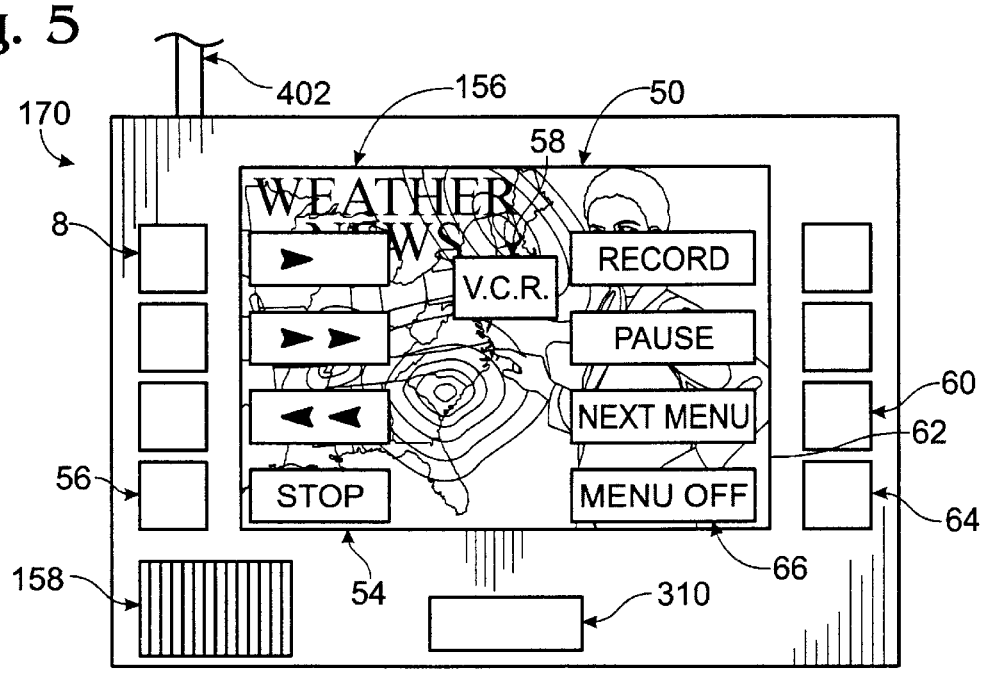
FIG. 5 is a front perspective view of a menu screen displayed on an image screen of a remote control for controlling functions of a video cassette recorder in accordance with the present invention.

FIG. 5 shows a different menu 50 from the menu 40 shown in FIG. 4. As indicated by the menu identifier 58, menu 50 allows control by a viewer of a VCR 206 connected to the docking station 202 associated with the remote control 170. When menu 50 is displayed on the image screen 156, the same button 56 which controlled the volume of the TV 200 when menu 40 was displayed now has a function of stopping a tape within the VCR 206. This is indicated by indicator 54 associated with button 56. The different numerical designation for the same button 56 when menu 50 is displayed versus 46 when menu 40 is displayed, indicates the different function associated with the button and not just the physical button. Thus, as mentioned above, the buttons 8 of the keypad 174 are "soft keys" whose functionality can be altered by selecting a different menu.

In both the menu 50 shown in FIG. 5 and the menu 40 shown in FIG. 4 the button 60, as indicated by indicator 62, progresses to the next menu. Button 64 turns off the display of menus on the image screen 156 such that only the program or image signal sent from the associated docking station 202 is displayed on the image screen 156 without any indicators or identifiers from any of the menus. The function of button 64 is given by indicator 66. Buttons 64 and indicator 66 are common to all available menus of the remote control 170 and remote control system 150. Activation of the display of menus is accomplished by pressing button 60, which has imprinted on it "MENU". In this way an indicator for button 60 is obviated.

FIG. 6 is a rear perspective view of the remote control 170 of FIGS. 4–5. A video output jack 14 is provided on a casing 4 of the remote control 170 to allow the image signal received by the RF antenna 402 to be output to an external display (not shown). The video output jack 14 may be a standard "mini phone plug" connector of either the mono or stereo audio type. Alternatively, other types of connectors, such as the "RCA," "phono plug" or S-Video connector could be used for outputting the audio and video signal received by the remote control 170.

FIG. 7 is a bottom perspective view of the remote control 170 of FIGS. 3–6. Located on the bottom of the remote control 170 is a pair of recharging contacts 16. The recharging contacts 16 are connected to a battery located within the casing 4 of the remote control 170. The battery supplies the necessary power to run the remote control 170 including the image screen 156. An on/off switch 159 is located on the casing of the video remote control 170.

FIG. 8 is a perspective view of a docking station 202 for use with the remote control 170. Located on the front of the docking station 202 is a docking port 22 adapted to securely hold the remote control 170 when not being held by a viewer.

Located on the bottom portion of the docking port 22 are recharging contacts 24. The size and spacing of the recharging contacts 24 are adapted to establish electrical contact with the recharging contacts 16 of the remote control 170 of FIGS. 3–7 when the remote control 170 is docked in the docking station 202. This allows power to flow from the docking station 202 to the remote control 170 to recharge the battery of the remote control. The docking station 202 is connected by a power cord to an AC power outlet.

Located on the top of the docking station 202 is a flexible RF antenna 26. The RF antenna 26 is used to communicate with the remote control 170. Within the docking station 202 is the transmitter 108 and control receiver 112 for sending and receiving RF signals via the RF antenna 26. Command signals from the remote control 170 are sent from the RF antenna 402 of the remote control 170 to the docking station 202. Image signals are sent to the remote control 170 from the docking station 202.

An IR transmitter 116 is connected by a cord to the docking station 202. The IR transmitter 116 produces pulses of IR light to control the TV 202 or other video devices 206, 208 to be controlled by the remote control 170. The cord carries signals from the docking station 202 to the IR transmitter 116.

Buttons 28 are located on the front of the docking station 28, including an on/off switch for the docking station 202. Additionally, a second button 28 is included as a pager to cause the remote control 202 to produce a distinctive audible alert. The audible alert allows a user to locate the remote controller when its whereabouts are not known.

FIG. 9 is a rear perspective view of the docking station 202 shown in FIG. 8. An AC power cord 70 plugs into a standard AC wall outlet. An AC power outlet 72 allows TV 200 to receive power through the docking station 202. Video-In connectors 74 allow video image signals to be received by the docking station 20 from TV 200, VCR 206, cable box, DSS dish, computer monitor, computer television such as a WEB-TV™ device, or other video device. Alternate embodiments of the present invention could allow multiple arrangements for users to connect multiple video devices and to allow the signals of such devices to pass through the docking station 202 to other video devices.

FIG. 10 is a perspective view of a TV 1100 with a docking station 1102 integrally formed as part of the TV 1100. The docking station 1102 has a docking port 1104 adapted to hold the remote control 170 shown in FIGS. 3–7. Battery contacts are located in the bottom of the docking port 1104 and contact the battery contacts of the remote control 170 when placed in the docking port 1104. An RF antenna 1106 is located on the top of the docking station 1102. An IR transmitter 116 is connected by a cord 1108 to the integrally formed TV 1100 and docking station 1102. The transmitter 116 is used by the present invention to send command signals received from the remote control 202 by the docking station 1102 to other video devices connected to the video inputs of the integrally formed TV 1100 and docking station 1102.

FIG. 11 shows a keyboard 1200 adapted for use with a computer television with a remote control 170. One problem with many current computer televisions is that the user may not easily use them while working in a home office or desk. Often the computer television is not located in the same place where a user typically performs computer tasks such as browsing the world-wide web or other computer networks. By providing the remote control 170, the user can browse the web or work on-line from a location remote from the television 200. Without the need for cables or wires normally associated with monitors and keyboards, the user is freed from watching TV 200 or going on-line within cable distance of the TV 200.

IR signals from the keyboard 1200 to the computer television may emanate from an IR transmitter located on the keyboard. The remote control 170 is positioned in front of the keyboard 1200 such that the IR sensor 310 of the remote control 170 receives the IR signals emanating from the IR transmitter of the keyboard 1200. The remote control 170 then transmits these signals to the docking station 202 by RF communication. The docking station 202 sends the appropriate IR signals in the appropriate format, e.g. Web TV, to the computer television via the IR transmitter 116. The IR transmitter 116 is positioned in front of the computer television. By sending the IR signals to the remote control 170, the user is freed from operating the keyboard 1200 in front of the computer television. With the present invention, the user can operate a computer television within the communication range of the remote control 202 and docking station 170.

In another embodiment, the remote control 170 need not send the signals to the docking station 202 but may send them directly to the image display devices such as the computer television. This can occur, for example, when the remote control 170 has an IR emitter to control the image display devices directly and outputs the appropriate command signals, e.g., the remote may be pre-programmed with these signals or learn the signals as a learning remote.

FIG. 12 shows an alternate embodiment of the present invention where the remote control 170 is integrated with a computer monitor or computer television such as a WEB-TV™ device. The remote control 170 has a keyboard 1300 with a tracking ball 1302 to allow a user to input commands and instructions to work on-line with standard browsers, web pages and on-line services. As with the remote control 2 shown in FIGS. 3–7, the remote control 170 receives display information and exchanges command and information signals via RF communication with a docking station 202, as shown in FIGS. 8 and 9. Additionally, the embodiment of the remote control 170 as a learning remote control is also applicable to use with a computer or Web-TV device.

Having described the present invention through examples of specific embodiments, the advantages of the present invention over conventional remote controls for video devices are evident to one of ordinary skill in the art. The viewer may control or watch programming from a variety of programming sources anywhere within the communication range between the remote control and docking station. Viewers have the advantage of using the present invention to watch programming on an other TV connected to the remote control, thereby freeing them from connecting cable or DSS systems to every TV they wish to watch.

By adapting the present invention to TVs with single or dual tuners, the present invention is able to provide the user with two distinct images at the same time without imposing one image on top of another as in PIP. In addition, a user without a TV with PIP can watch two programs at once. Additionally, the present invention has the flexibility of allowing users to use computer television such as WEB-TV™ devices anywhere within the communication range of the present invention.

By use of the image screen of the remote control, the present invention is able to simplify the procedure of having the present invention emulate multiple remote controls. In this manner the present invention is a learning remote control which can learn and emulate the IR command signals of any remote. The use of soft keys, and the touch screen, allows a minimal number of keys to be located on the casing of the remote control. This greatly simplifies operation for the user. Additionally, the size of the image screen allows users with reduced sight capabilities to more easily identify the functionality of the buttons of the keypad, in contrast to the many small buttons of conventional remote controls.

Those skilled in the art will readily appreciate that various modifications can be made to the above exemplary embodiments without departing from the spirit of the invention. For example, while the embodiments of the remote control 2 are shown in FIGS. 3–7 with buttons 8, other embodiments of the present invention could use dials, rocker switches, or other controls. Although the embodiments described above exemplify a docking station formed as a separate device, other embodiments of the present invention could utilize a TV or other video device with the docking station formed as an integral component as shown in FIG. 10. The above description focused on the use of certain RF frequencies and transmission rates between the docking station and the remote control and IR transmission between the remote control system and the image display devices. Those of ordinary skill in the art will recognize that other frequencies and transmission rates could be used in alternate embodiments.

What is claimed is:

1. A remote control system for use with an audio/visual display device, wherein the audio/visual display device includes a receiver in a primary audio/visual display device for receiving plural audio/visual signals representing different, plural audio/visual programs, the remote control system comprising:

a controller for selecting between the plural audio/visual programs and for controlling the source of a primary program displayed on the primary audio/visual display and the source of a secondary program displayed on a remote audio/visual display device;

an image processor in the audio/visual display device for generating a secondary audio/visual signal from a received signal for a secondary program;

a transmitter in the audio/visual display device for transmitting said secondary audio/visual signal; and a wireless remote control having said remote audio/visual display for displaying audio and video corresponding to said secondary audio/visual signal and a control signal generator for generating a signal for controlling the audio and video on the primary audio/visual device and for controlling audio and video on said remote audio/visual display.

2. The remote control system of claim 1 wherein said remote control is a learning remote control.

3. The remote control system of claim 1 wherein said primary program and said secondary program have the same source.

4. The remote control system of claim 1 wherein said primary program and said secondary program have different sources.

5. The remote control system of claim 1 wherein said wireless remote control includes a soft key mechanism for providing a variety of menus on said display for controlling the audio/visual display device.

6. The remote control system of claim 1 which includes a docking station hard-wired to the audio/visual display device for receiving said wireless remote control therein.

7. An audio/visual display system for displaying at least two distinct audio/visual programs, said display system comprising:

a first audio/visual source for outputting a first audio/visual signal;

a second audio/visual source for outputting a second audio/visual signal;

a first controller for selecting an audio/visual program to be displayed;

an audio/visual display for displaying a selected audio visual program thereon;

a first wireless transmitter for transmitting one of said audio/visual signals;

a video remote control (VRC) including:

a VRC receiver for receiving said transmitted audio/visual signal transmitted by said first transmitter;

a VRC display for displaying a audio/visual program corresponding to said transmitted audio/visual signal;

a VRC controller for producing control signals based upon inputs by a user; and a VRC wireless transmitter for transmitting said control signals;

wherein said first controller is responsive to said control signals from said VRC controller.

8. The audio/visual display system of claim 7 further comprising an audio/visual device that includes at least one of said audio/visual sources.

9. The audio/visual display system of claim 8 wherein said audio/visual device is a television.

10. The audio/visual display system of claim 8 wherein said audio/visual source is taken from the group of audio/visual sources consisting of television broadcast, television analog and digital cable satellite, DSS, VCR, DVD and computer.

11. The audio/visual display system of claim 7 wherein said audio/visual program contains video only.

12. The audio/visual display system of claim 7 wherein said audio/visual program contains audio only.

13. The audio/visual display system of claim 7 wherein said first wireless transmitter and said VRC receiver operate in a frequency range between approximately 5.15 GHz and 5.85 GHz.

14. The audio/visual display system of claim 7 wherein said first wireless transmitter and said VRC receiver operate in a wavelength range between approximately 0.8 $\mu$m and 1.2 $\mu$m.

15. The audio/visual display system of claim 7 wherein said VRC display input options of said VRC controller correspond to said control signals for selection by said user.

16. The audio/visual display system of claim 15 wherein said VRC display is touch sensitive such that said input option is selected by said user by touching portions of said VRC display.

17. The audio/visual display system of claim 15 wherein said display of said input options on said VRC display is a soft key display.

18. The audio/visual display system of claim 7 further comprising a docking station including said first wireless transmitter.

19. The audio/visual display system of claim 18 wherein the docking station further includes at least one of said audio/visual sources.

20. A method of displaying any of several audio/visual programs on an audio/visual display system, wherein the audio/visual display system includes a primary audio/visual display device and a wireless remote control having a secondary audio/visual display therein, said method comprising:

selecting a mode of operation of the display system;

displaying a first audio/visual program on the primary audio/visual display device; and displaying a second audio/visual program, selected from all available audio/visual programs, on the secondary audio/visual display on said remote control.

21. The method of claim 20 wherein said selecting step includes:

inputting said mode selection to said video image display system.

22. The method of claim 21 wherein said inputting occurs on said remote control.

23. The method of claim 20 wherein said displaying said second audio/visual program step includes:

showing on the wireless remote audio/visual display available modes of operation of the audio/visual display system.

24. The method of claim 20 further comprising:

transmitting said selected mode input to said remote control; and receiving in said audio/visual display on the remote control said transmitted selected mode.

25. The method of claim 20 further comprising:

playing a first audio signal associated with said first audio/visual program on the primary audio/visual display device.

26. The method of claim 20 further comprising:

playing a second audio signal associated with said second audio/visual program on the remote control.

27. The method of claim 20 wherein the displayed second audio/visual program is distinct from the displayed first audio/visual program.

28. The method of claim 20 wherein the displayed second audio/visual program is the same as the displayed first audio/visual program.

* * * * *